United States Patent
Xie et al.

(10) Patent No.: US 9,799,748 B1
(45) Date of Patent: Oct. 24, 2017

(54) METHOD OF FORMING INNER SPACERS ON A NANO-SHEET/WIRE DEVICE

(71) Applicant: GLOBALFOUNDRIES Inc., Grand Cayman (KY)

(72) Inventors: Ruilong Xie, Niskayuna, NY (US);
Min Gyu Sung, Latham, NY (US);
Chanro Park, Clifton Park, NY (US);
Hoon Kim, Clifton Park, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/398,335

(22) Filed: Jan. 4, 2017

(51) Int. Cl.
*H01L 21/00* (2006.01)
*H01L 29/66* (2006.01)
*H01L 21/306* (2006.01)
*H01L 21/308* (2006.01)

(52) U.S. Cl.
CPC .... *H01L 29/66553* (2013.01); *H01L 21/3085* (2013.01); *H01L 21/30604* (2013.01); *H01L 29/66545* (2013.01); *H01L 29/66795* (2013.01)

(58) Field of Classification Search
CPC ......... H01L 29/66553; H01L 21/30604; H01L 29/66795; H01L 29/66545; H01L 21/3085
See application file for complete search history.

(56) References Cited

U.S. PATENT DOCUMENTS 9,178,036 B1 * 11/2015 Xie .................. H01L 21/28176
9,478,538 B1 * 10/2016 Kim .................... H01L 27/088
2017/0179246 A1 * 6/2017 Xie ..................... H01L 29/4232

* cited by examiner

*Primary Examiner* — Richard Booth
(74) *Attorney, Agent, or Firm* — Amerson Law Firm, PLLC

(57) ABSTRACT

A method includes forming a stack of semiconductor material layers above a substrate. The stack includes at least one first semiconductor material layer and at least one second semiconductor material layer. A first etching process is performed on the stack to define cavities. The cavities expose end portions of the first and second semiconductor material layers. Portions of the first semiconductor material layer are removed to define end recesses. A layer of insulating material is formed in the end recesses and at least partially fills the cavities. A second etching process is performed on the stack to remove end portions of the at least one second semiconductor material layer and to remove portions of the layer of insulating material in the cavities not disposed between the first and second semiconductor material layers so as to form inner spacers on ends of the at least one first semiconductor material layer.

19 Claims, 6 Drawing Sheets

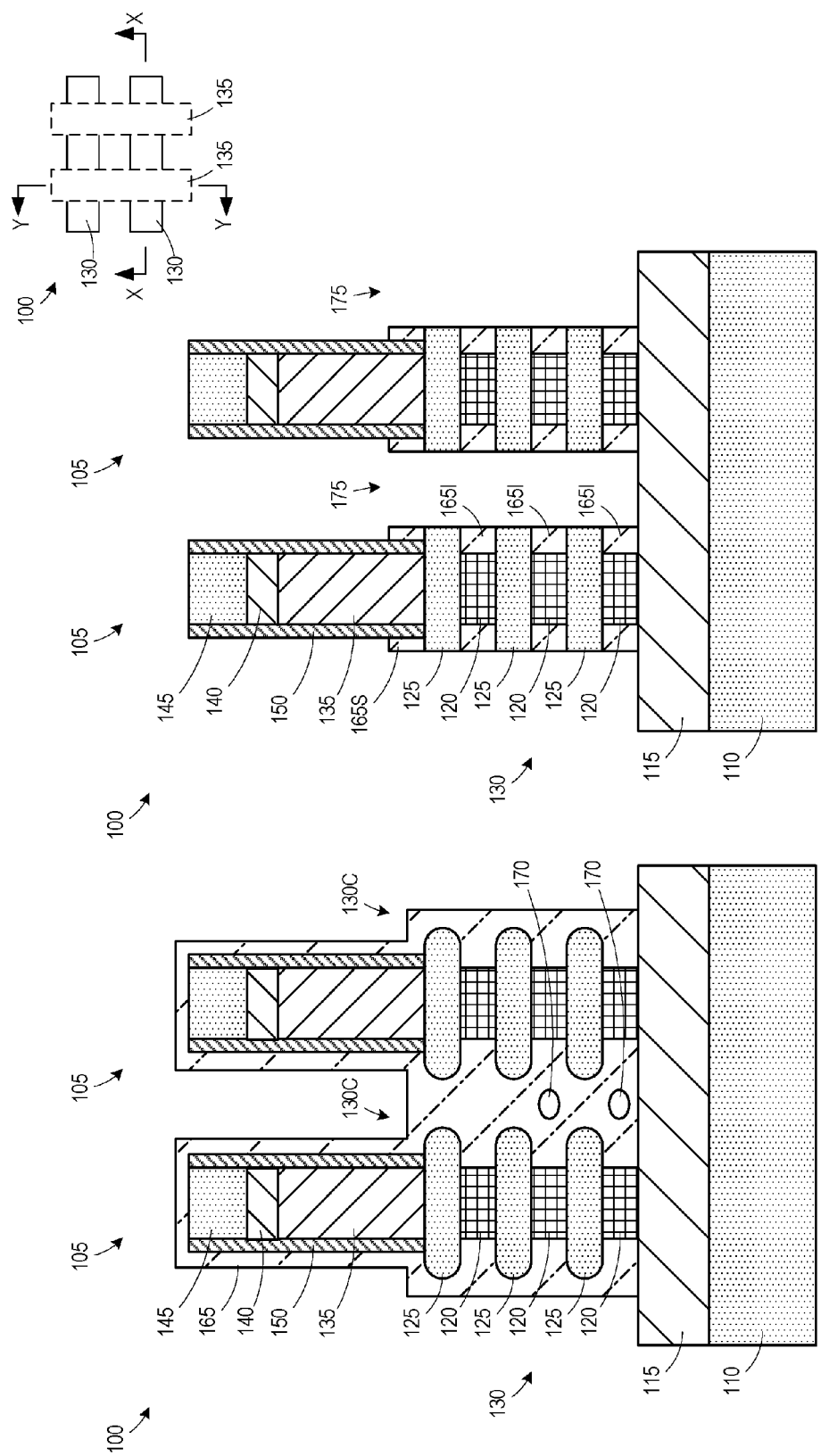

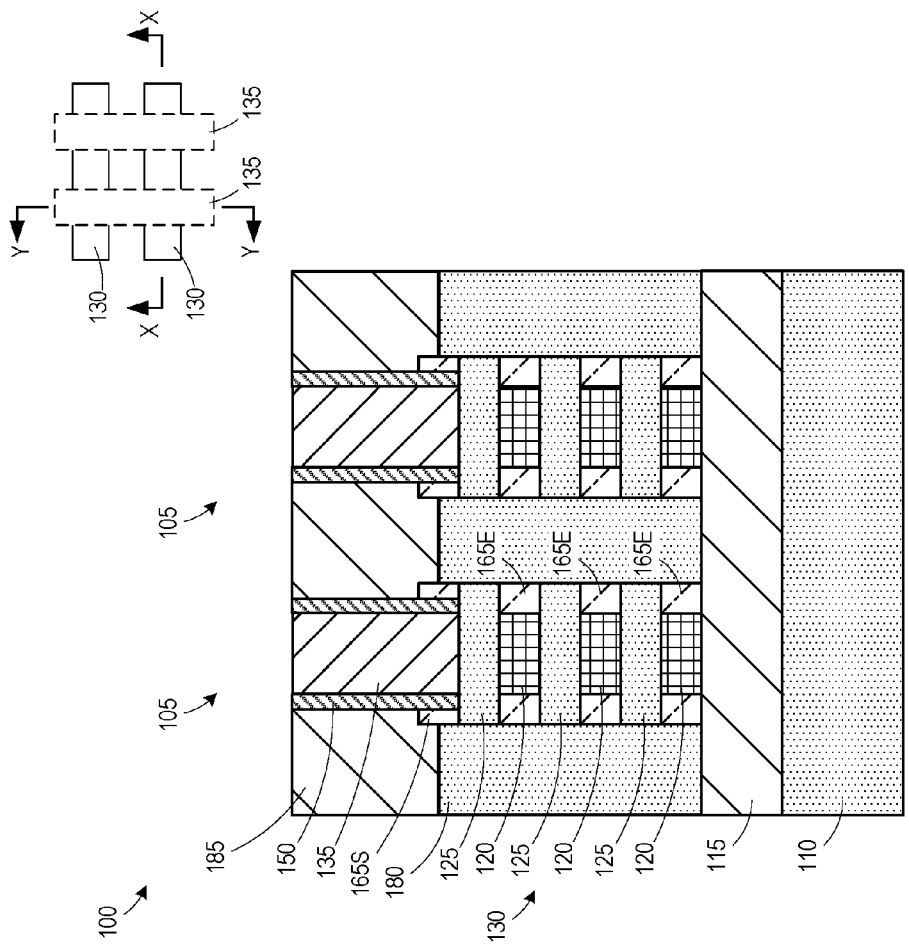
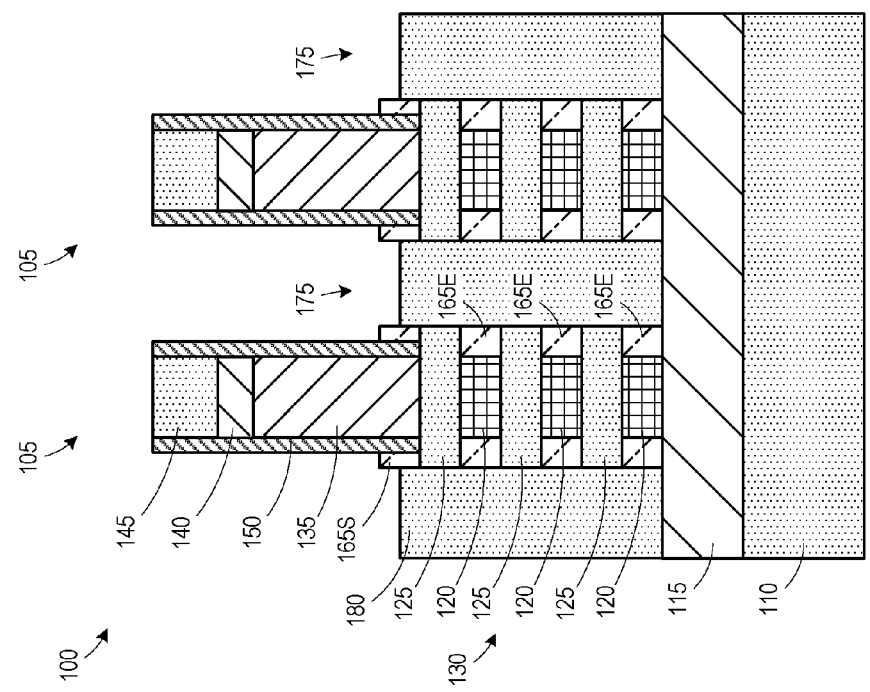
Figure 1G
Figure 1H

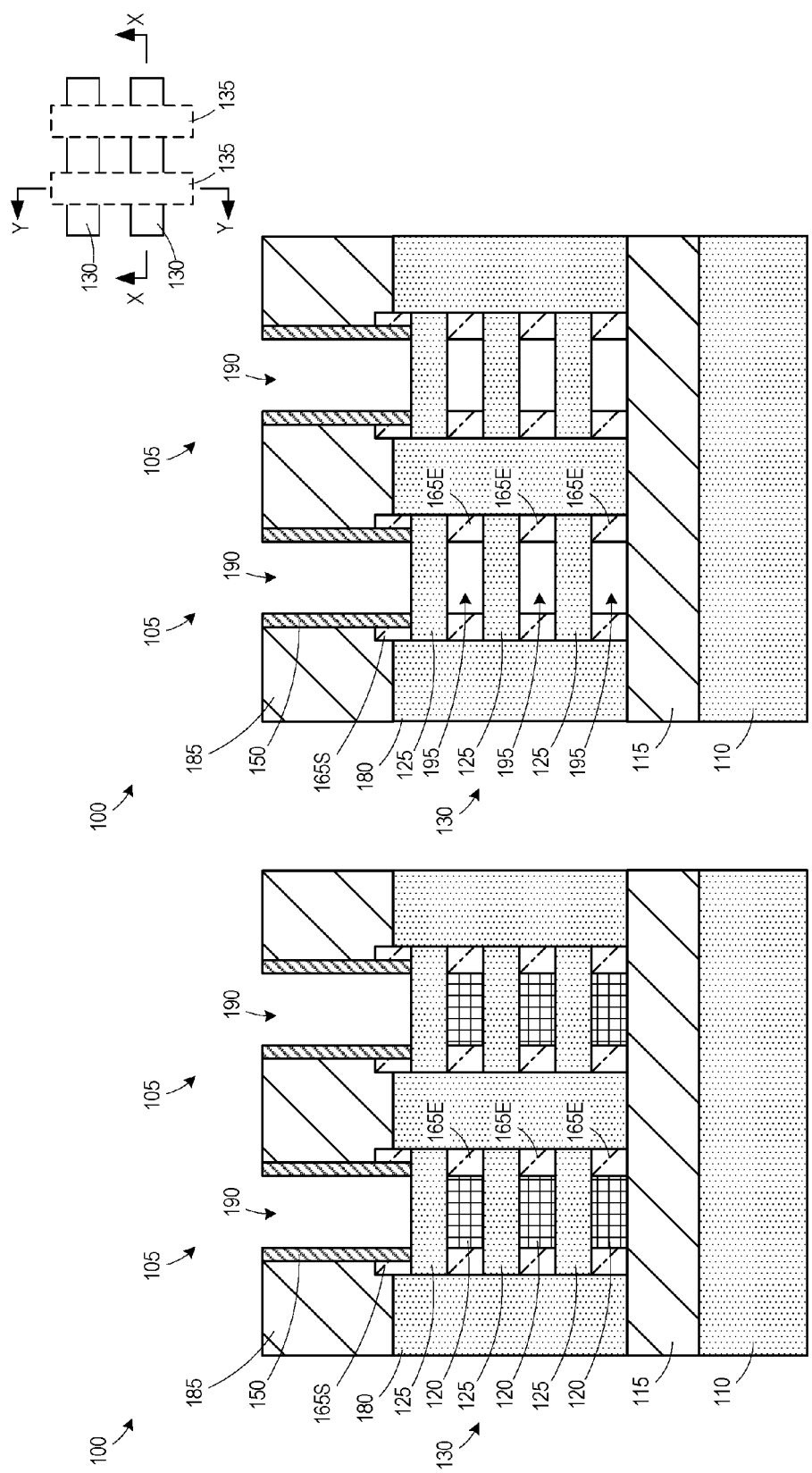

METHOD OF FORMING INNER SPACERS ON A NANO-SHEET/WIRE DEVICE

BACKGROUND OF THE INVENTION

1. Field of the Invention

Generally, the present disclosure relates to the manufacture of semiconductor devices, and, more specifically, to various novel methods of forming inner spacers on a nano-sheet or nano-wire device.

2. Description of the Related Art

In modern integrated circuits, such as microprocessors, storage devices and the like, a very large number of circuit elements, especially transistors, are provided on a restricted chip area. Transistors come in a variety of shapes and forms, e.g., planar transistors, FinFET transistors, nanowire devices, etc. The transistors are typically either NMOS (NFET) or PMOS (PFET) type devices wherein the "N" and "P" designation is based upon the type of dopants used to create the source/drain regions of the devices. So-called CMOS (Complementary Metal Oxide Semiconductor) technology or products refers to integrated circuit products that are manufactured using both NMOS and PMOS transistor devices. Irrespective of the physical configuration of the transistor device, each device comprises drain and source regions and a gate electrode structure positioned above and between the source/drain regions. Upon application of an appropriate control voltage to the gate electrode, a conductive channel region forms between the drain region and the source region.

A conventional FET is a planar device wherein the entire channel region of the device is formed parallel and slightly below the planar upper surface of the semiconducting substrate. In contrast to a planar FET, there are so-called 3D devices, such as an illustrative FinFET device, which is a three-dimensional structure.

One type of device that shows promise for advanced IC products of the future is generally known as a nano-sheet device. In general, a nano-sheet device has a fin-type channel structure that is comprised of a plurality of vertically spaced-apart sheets of semiconductor material. A gate structure for the device is positioned around each of these spaced-apart layers of channel semiconductor material. Such a nano-sheet device may be formed as part of a high speed logic circuit. Typically, the nano-sheet device may be operated at a relatively low voltage, e.g., 1 V or less (based on today's technology), and it is specifically designed for high-speed operation and low-power consumption (especially for IC products that are employed in mobile devices like smartphones).

Typically, during the fabrication of nano-sheet or nano-wire devices, spacers are employed on sidewalls of a multi-layer stack of semiconductor material layers (e.g., SiGe and Si). Spacers are typically formed by selectively etching back the sacrificial layer (e.g., SiGe) to define end recesses between the semiconductor material layers. Since the selective etch process exhibits imperfect selectivity, corner rounding may occur on the non-sacrificial semiconductor material layers (e.g., Si). Subsequently, a conformal layer of insulating material is formed and an isotropic etch back process is performed to reveal the channel material of the multi-layer stack. Due to the proximity of the devices resulting from an aggressive pitch, pinch-off of the insulating material may occur in the cavity between adjacent multi-layer stacks, thus interfering with the etch back process.

The present disclosure is directed to various novel methods of forming inner spacers on a nano-sheet device and resulting structures that may solve or reduce one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various novel methods of forming inner spacers on a nano-sheet device. One illustrative method disclosed herein includes, among other things, forming a stack of semiconductor material layers above a substrate. The stack includes at least one first semiconductor material layer and at least one second semiconductor material layer. The first and second semiconductor material layers are arranged in alternating fashion and the first and second semiconductor material layers are comprised of materials that may be selectively etched relative to one another. A first etching process is performed on the stack to define cavities in the stack. The cavities expose end portions of first and second semiconductor material layers. Portions of the at least one first semiconductor material layer are removed to define end recesses. A layer of insulating material is formed in the end recesses and at least partially fills the cavities. A second etching process is performed on the stack to remove end portions of the at least one second semiconductor material layer and to remove portions of the layer of insulating material in the cavities not disposed between the first and second semiconductor material layers so as to form inner spacers on ends of the at least one first semiconductor material layer.

One illustrative method disclosed herein includes, among other things, forming a stack of semiconductor material layers above a substrate. The stack includes at least one first semiconductor material layer and at least one second semiconductor material layer. The first and second semiconductor material layers are arranged in alternating fashion and the first and second semiconductor material layers are comprised of materials that may be selectively etched relative to one another. A gate structure is formed above the stack. A spacer structure is formed on sidewalls of the gate structure. The stack is etched using the gate structure and the spacer structure as an etch mask to define cavities in the stack. The cavities expose end portions of first and second semiconductor material layers. A portion of the spacer structure is removed to define a reduced width spacer structure. Portions of the at least one first semiconductor material layer are removed to define end recesses. A layer of insulating material is formed in the end recesses and at least partially fills the cavities. The stack is etched using the gate structure and the reduced width spacer structure as an etch mask to remove end portions of the at least one second semiconductor material layer and to remove portions of the layer of insulating material not disposed between the first and second semiconductor material layers so as to form inner spacers on ends of the at least one first semiconductor material layer.

BRIEF DESCRIPTION OF THE DRAWINGS

The disclosure may be understood by reference to the following description taken in conjunction with the accompanying drawings, in which like reference numerals identify like elements, and in which:

FIGS. 1A-1K depict various illustrative novel methods disclosed herein for forming inner spacers on a nano-sheet device.

Figures 1A, 1B:
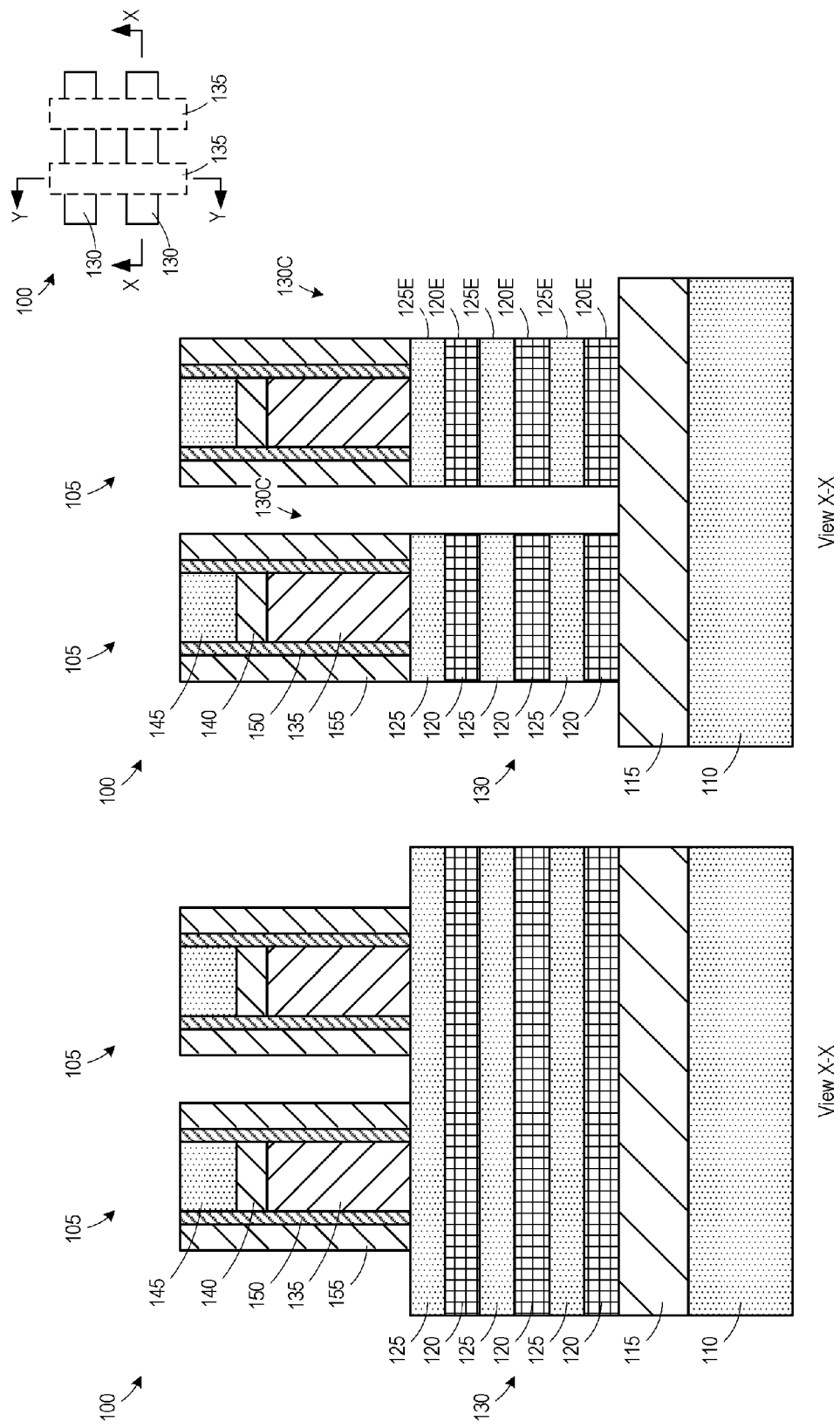

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase. As will be readily apparent to those skilled in the art upon a complete reading of the present application, the methods disclosed herein may be employed in manufacturing a variety of different devices, including, but not limited to, logic devices, memory devices, etc., and the devices may be may be either NMOS or PMOS devices.

As will be appreciated by those skilled in the art after a complete reading of the present application, various doped regions, e.g., source/drain regions, halo implant regions, well regions and the like, are not depicted in the attached drawings. Of course, the inventions disclosed herein should not be considered to be limited to the illustrative examples depicted and described herein. The various components and structures of the integrated circuit devices 100 disclosed herein may be formed using a variety of different materials and by performing a variety of known techniques, e.g., a chemical vapor deposition (CVD) process, an atomic layer deposition (ALD) process, a thermal growth process, spin-coating techniques, etc. The thicknesses of these various layers of material may also vary depending upon the particular application. With reference to the attached figures, various illustrative embodiments of the methods and devices disclosed herein will now be described in more detail.

FIGS. 1A-1K depict various illustrative novel methods disclosed herein for forming inner spacers on an IC product 100 including a nano-sheet device 105. In the examples depicted herein, the integrated circuit product 100 will be formed in and above a semiconductor substrate 110. The substrate 110 may have a variety of configurations, such as the depicted semiconductor-on-insulator (SOI) configuration that includes a bulk semiconductor layer, a buried insulation layer 115 positioned on the bulk substrate 110 and one or more semiconductor material layers 120, 125 positioned on the buried insulation layer 115. Alternatively, the substrate 110 may have a simple bulk configuration. The substrate 110 may be made of silicon or it may be made of materials other than silicon, e.g., silicon-germanium, a III-V compound semiconductor material, etc. Thus, the terms "substrate" or "semiconductor substrate" should be understood to cover all semiconducting materials and all forms of such materials.

In the example depicted herein, the IC product 100 is comprised of illustrative nano-sheet transistor devices 105. In one example, the nano-sheet devices 105 may be formed as part of a high speed logic circuit. The illustrative device 100 depicted herein will be formed with a plurality of stacks 130 and gate structures 135 (depicted in dashed lines in the plan view) formed across the stacks 130. In some embodiments, the stacks 130 may be fin-like structures (i.e., a stack of nano-sheets having a narrow width compared to its axial length). Each stack 130 includes the plurality of alternating semiconductor material layers 120, 125. The drawings contain a simplistic plan view of the product 100 and the nano-sheet devices 105 indicating where various cross-sectional views are taken. An "X-X" view is taken in the gate length direction of the device 105 (perpendicular to the gate structure 135), and a "Y-Y" view (see FIG. 1K) is taken in a gate width direction of the device 105 (along an axial length of the gate structure 135). However, no attempt will be made to show the various steps depicted in the cross-sectional views in the drawings in the plan view of the product 100.

FIG. 1A depicts the product 100 at a point in fabrication wherein several process operations have been performed. First, alternating semiconductor material layers 120, 125 were formed above the substrate 110. Thereafter, a masking layer (not shown) was formed above the uppermost semiconductor material layer 125. An etching process was performed to define the stacks 130. In general, the semiconductor material layers 120, 125 are made of different semiconductor materials, and they are made of materials that may be selectively removed (by etching) relative to one another. In the examples depicted herein, the semiconductor material layers 120 are sacrificial in nature while the semiconductor material layers 125 will become the channel region material for the nano-sheet devices 105. In one illustrative embodiment, the semiconductor material 120 may comprise silicon-germanium ($Si_xGe_{(1-x)}$ where x ranges from 0.0 to 0.9) and the semiconductor material 125 may comprise substantially pure silicon. The thicknesses of the semiconductor material layers 120, 125 may vary depending upon the particular application and they need not have the same thicknesses, although they may in some applications. In one illustrative embodiment, the semiconductor material layers 120 may have a thickness of about 8-15 nm, while the semiconductor material layers 125 (i.e., the channel materials) may have a thickness of about 6-10 nm. The number of semiconductor material layers 120, 125 that are formed may also vary depending upon the particular application. In the illustrative example depicted herein, three layers of each type of semiconductor material layer 120, 125 were formed above the substrate 110.

The semiconductor material layers 120, 125 may be formed using a variety of techniques. In one illustrative example, where the substrate 110 is an SOI substrate, the substrate may be obtained from the substrate supplier with an active layer comprising the first semiconductor material layer 120. Alternatively, the active layer of the SOI substrate may be silicon as originally supplied by the substrate supplier. The active silicon layer may be converted to a layer of silicon germanium by epitaxially depositing a germanium-containing material (e.g., SiGe) or germanium on the silicon active layer, and thereafter performing an anneal process to cause the germanium in the germanium or silicon germanium layer to diffuse into the silicon active layer. In yet another example, the substrate 110 may be a simple bulk silicon substrate. In that case, the first semiconductor material layer 120, e.g., silicon germanium, may be epitaxially deposited on the upper surface of the bulk silicon substrate. Irrespective of how the first semiconductor material layer 120 is formed, the subsequent semiconductor material layers 120, 125 may be sequentially deposited on the substrate 110 by performing multiple epitaxial deposition processes.

After forming the stacks 130, the gate structures 135 were formed thereabove, contacting top and sidewall surfaces of the stacks 130. In the illustrated embodiment, the gate structures 135 are sacrificial in nature in that they are replaced at a later point in the process flow with other materials to form functional gate structures, as described below. The gate structures 135 may include one or more layers of material, such as a sacrificial gate insulation layer (e.g., silicon dioxide), and a sacrificial gate material (e.g., amorphous silicon)—not separately shown. First and second cap layers 140, 145 (e.g., silicon nitride and silicon dioxide) formed from patterned hard mask layers employed to pattern the gate structures 135 are positioned above the gate structures 135. First and second sidewall spacers 150, 155 (e.g., SiCO and silicon nitride) are formed on sidewalls of the gate structures 135. In one embodiment, each spacer 150, 155 may be formed by depositing a conformal layer of spacer material and performing an anisotropic etch process on the layer of spacer material.

FIG. 1B depicts the product 100 after one or more etch processes were performed to recess portions of the stacks 130 to define cavities 130C exposing end portions 120E, 125E of the semiconductor material layers 120, 125, respectively. The etch process is self-aligned with respect to the second spacer 155. In one embodiment, the etch process may be an anisotropic etch.

Figures 1C, 1D:
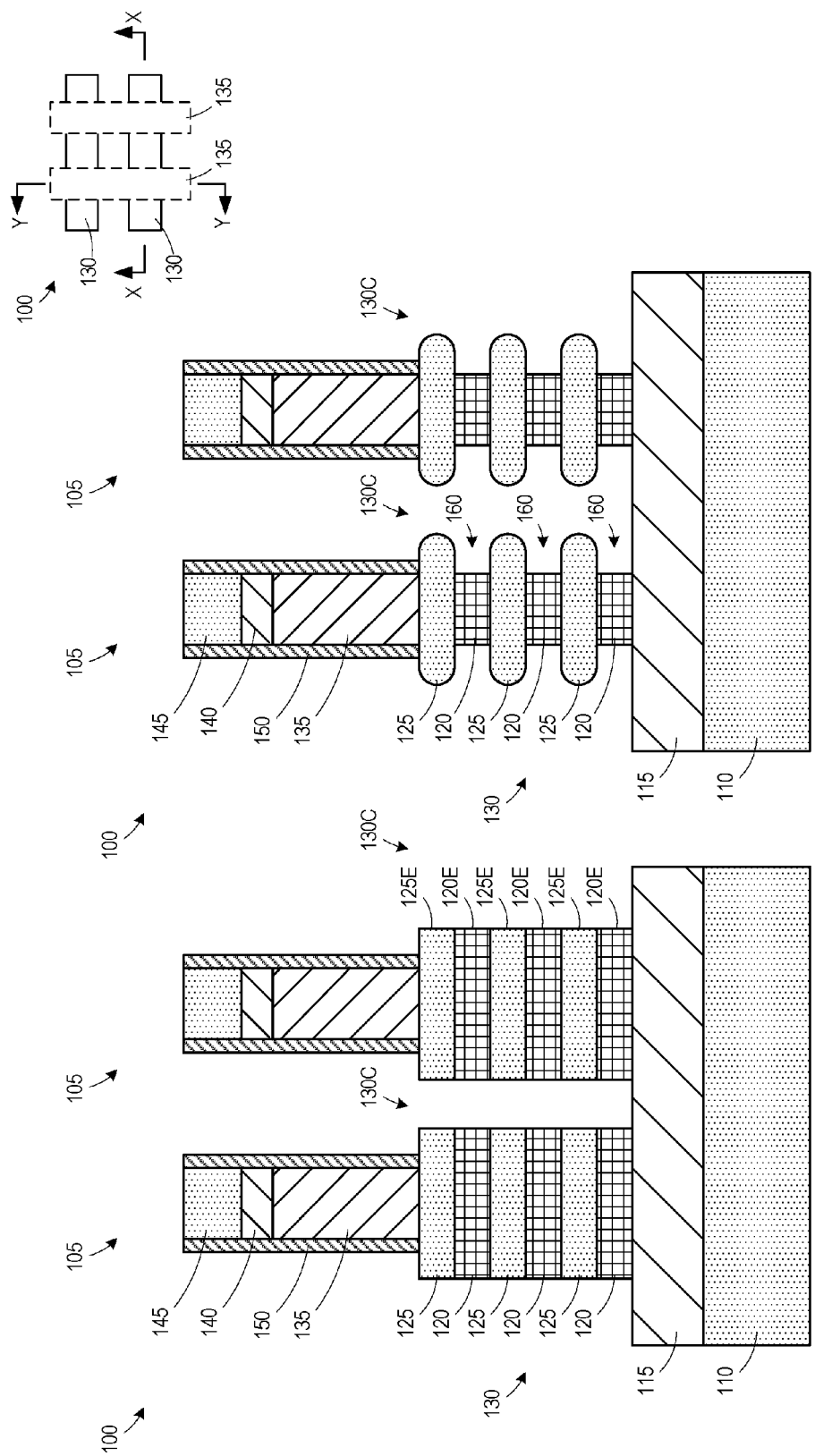

FIG. 1C depicts the product 100 after an isotropic etch process was performed to remove the second spacer 155. In the illustrated embodiment, the second spacer 155 is SiN and is removed by a wet or dry etch that is selective to SiCO.

FIG. 1D depicts the product 100 after an isotropic etch process was performed to recess the semiconductor material layers 120 to define end recesses 160 on ends of the semiconductor material layers 120. Because the etch process is not perfectly selective, corner rounding may occur on portions of the semiconductor material layers 125, as illustrated in FIG. 1D.

FIG. 1E depicts the product 100 after a conformal deposition process, such as an ALD process, was performed to form a layer of insulating material 165 (e.g., silicon nitride) above the product 100. The layer of insulating material 165 may be formed to any desired thickness. The layer of insulating material 165 substantially fills the end recesses 160. The layer of insulating material 165 is also disposed in the cavities 130C. In some embodiments, pinch-off may occur on portions of the layer of insulating material 160 in the cavities 130C between the stacks 130. The cavities 130C may be entirely filled, or voids 170 may be present.

FIG. 1F depicts the product 100 after an anisotropic etch process was performed. The etch process is self-aligned with the first spacer 150 and may etch the materials of the layer of insulating material 165 (e.g., silicon nitride) and the semiconductor material layers 120 (e.g., silicon) selectively to the materials of the second cap layer 145 (e.g., silicon dioxide) and the first spacer 150 (e.g., SiCO). The etch terminates on the buried insulating layer 115. The etching of the portion of the layer of insulating material 165 disposed on the spacer 150 results in the formation of a spacer 165S due to the anisotropic nature of the etch process. Inner spacers 165I remain in the end recesses 160. The rounded corners of the semiconductor material layers 125 are also removed (or reduced in severity) by the etching process. The final width of the inner spacers 165I, and also the final width of the semiconductor material layers 125, are determined by the combined widths of the spacer 150 and the spacer 165S (i.e., which depends on the initial thickness of the layer of insulating material 165). Cavities 175 are defined between adjacent devices 105.

FIG. 1G illustrates the product 100 after an epitaxial deposition process was performed to define source/drain material 180 in the cavities 175. The source/drain material 180 may be doped in situ during the growth process, or implantation processes may be completed at a later time to dope the source/drain material 180.

FIG. 1H illustrates the product 100 after a plurality of processes was performed. A dielectric layer 185 was deposited to overfill the recesses 175. A planarization process was performed to expose upper surfaces of the gate structures 135 by removing portions of the dielectric layer 185, the second cap layer 145, and the first cap layer 140.

FIG. 1I illustrates the product 100 after one or more selective etch processes were performed to remove the gate structures 135 (i.e., the sacrificial gate material and underlying sacrificial gate insulation layer) to define replacement gate cavities 190.

FIG. 1J illustrates the product after a selective etch process was performed to remove the semiconductor material layers 120 selectively to the semiconductor material layers 125. In one embodiment, the etching process may be a wet etching process. This process operation results in the formation a plurality of vertically spaced-apart semiconductor material layers 125 within the gate cavities 190 for the nano-sheet devices 105 with open spaces 195 disposed therebetween in what will become the channel region for the nano-sheet devices 105. It should be noted that, at this point in time, portions of the spaced-apart semiconductor material layers 125 extend into and out of the plane of the drawing page. Additionally, the semiconductor material layers 120 may remain positioned between the semiconductor material layers 125 in the regions outside of the gate cavities 190 that were not replaced by the source/drain regions. Thus, the spaced-apart semiconductor material layers 125 on the nano-sheet devices 105 within the gate cavity 190 are fully supported after the portions of the semiconductor material layers 120 within the gate cavities 190 of the nano-sheet devices 105 have been removed.

Figure 1K:
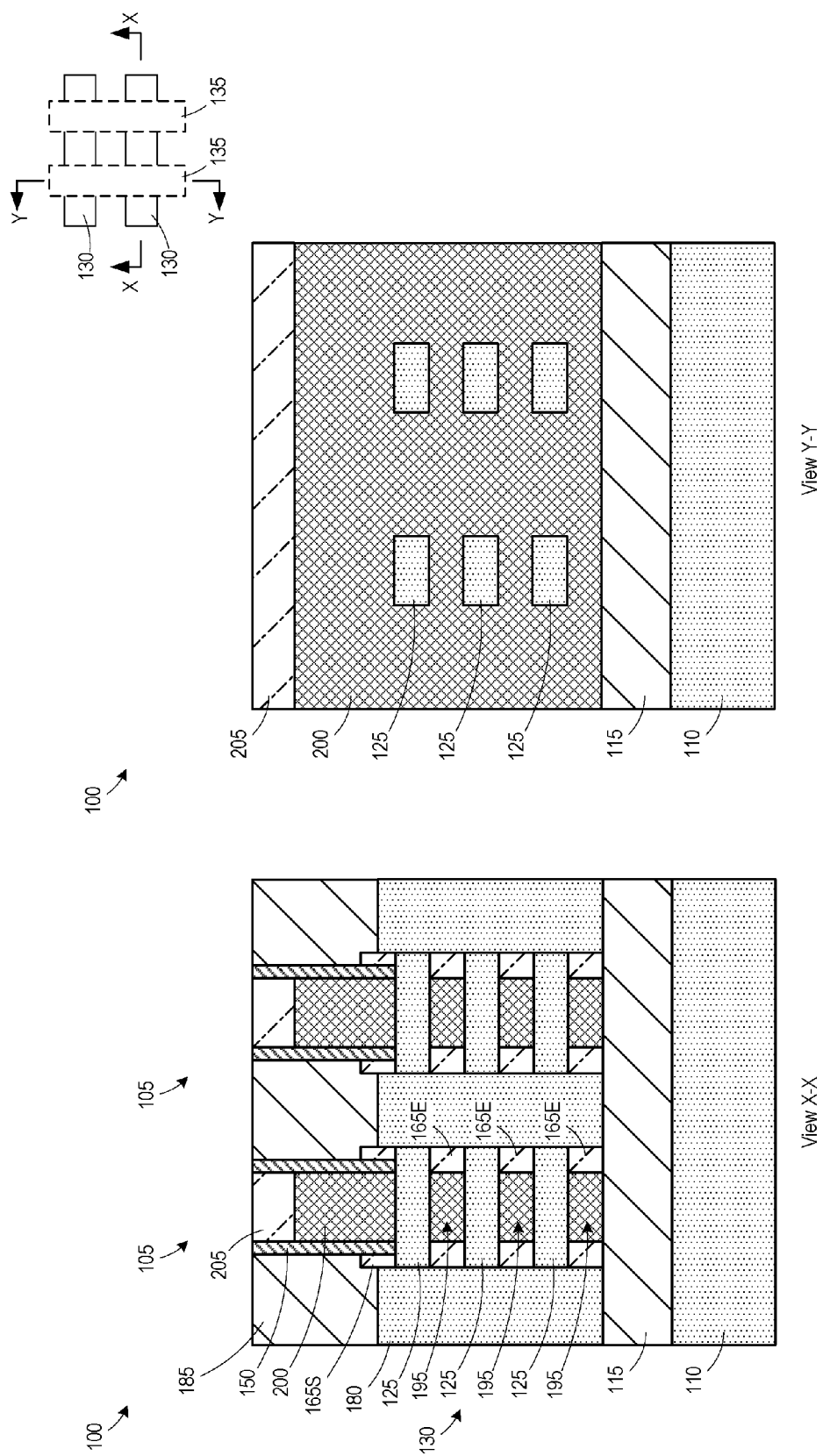

FIG. 1K illustrates the product 100 after a plurality of processes was performed to define final or replacement gate structures 200 in the gate cavities 190. A "Y-Y" view is also illustrated in FIG. 1K. The simplistically depicted replacement gate structures 200 were formed in the gate cavities 190 by depositing the materials for the replacement gate structures 200 in the gate cavities 190, performing a planarization process to remove excess gate materials positioned outside of the gate cavities 190, recessing the materials for the replacement gate structures 200 and forming a gate cap layer 205 above the recessed gate materials. The replacement (or final) gate structures 200 are intended to be representative of any kind of gate structure that may be formed on semiconductor devices. For example, the gate structures 200 may comprise a gate insulation layer (not separately shown) that is comprised of a variety of different materials, such as, for example, silicon dioxide, a so-called high-k (k greater than 10) insulation material (where k is the relative dielectric constant), etc. Similarly, the gate structures 200 may have one or more metal layers (not separately shown) that act as all or a portion of the gate electrode for the devices 105. At the point of processing depicted in FIG. 1K, other processing activities may also be performed, e.g., the formation of doped halo implant regions (not shown), doped source/drain regions (not shown), etc. Note that the nano-sheet devices 105 shown in FIG. 1K are gate-all-around (GAA) devices in that the spaces 195 between the spaced-apart channel semiconductor material layers 125 are filled with the material of the gate structures 200.

The use of the two spacers 150, 155 in self-aligned etch processes to define the inner spacers 165I mitigates problems associated with pinch-off of the layer of insulating material 165. In addition, most or all of the portions of the semiconductor material layers 125 exhibiting corner rounding are removed.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. As used herein, spatial references "top," "bottom," "upper," "lower," "vertical," "horizontal" and the like may be used for convenience when referring to structures of FET devices. These references are intended to be used in a manner consistent with the drawings only for teaching purposes, and are not intended as absolute references for FET structures. For example, FETs may be oriented spatially in any manner different from the orientations shown in the drawings. Accordingly, the protection sought herein is as set forth in the claims below.

What is claimed:

1. A method, comprising:
    forming a stack of semiconductor material layers above a substrate, said stack including at least one first semiconductor material layer and at least one second semiconductor material layer, wherein said first and second semiconductor material layers are arranged in alternating fashion and wherein said first and second semiconductor material layers are comprised of materials that may be selectively etched relative to one another;
    performing a first etching process on said stack to define cavities in said stack, said cavities exposing end portions of said first and second semiconductor material layers;
    removing portions of said at least one first semiconductor material layer to define end recesses;
    forming a layer of insulating material in said end recesses and at least partially filling said cavities; and
    performing a second etching process on said stack to remove end portions of said at least one second semiconductor material layer and to remove portions of said layer of insulating material in said cavities not disposed between said first and second semiconductor material layers so as to form inner spacers on ends of said at least one first semiconductor material layer.

2. The method of claim 1, further comprising:
    forming a gate structure above said stack;
    forming a spacer structure on sidewalls of said gate structure;
    performing said first etching process in the presence of said spacer structure;
    removing at least a portion of said spacer structure; and
    performing said second etching process after removing said at least said portion of said spacer structure.

3. The method of claim 2, wherein said spacer structure comprises a first spacer and a second spacer formed above said first spacer, and removing said at least said portion of said spacer structure comprises removing said second spacer.

4. The method of claim 2, further comprising:
    removing said gate structure to define a gate cavity exposing said stack of semiconductor material layers;
    removing a portion of said at least one first semiconductor material layer exposed by said gate cavity; and
    forming a replacement gate structure in said gate cavity and in a space created by the removal of said portion of said at least one first semiconductor material layer.

5. The method of claim 2, wherein performing said second etch process comprises etching said layer of insulating material to define a second spacer on said spacer structure.

6. The method of claim 1, wherein forming said layer of insulating material comprises performing a conformal deposition process.

7. The method of claim 1, further comprising forming a source/drain material in said cavities, wherein said inner spacers are disposed between said at least one first semiconductor material layer and said source/drain material.

8. The method of claim 1, wherein said at least one first semiconductor material layer comprises silicon germanium, and said at least one second semiconductor material layer comprises silicon.

9. The method of claim 1, wherein said at least one first semiconductor material layer comprises a plurality of first semiconductor material layers, and said at least one second semiconductor material layer comprises a plurality of second semiconductor material layers alternating with said plurality of said first semiconductor material layers.

10. The method of claim 1, wherein said end portions of said at least one second semiconductor material layer comprises rounded end portions.

11. A method, comprising:
forming a stack of semiconductor material layers above a substrate, said stack including at least one first semiconductor material layer and at least one second semiconductor material layer, wherein said first and second semiconductor material layers are arranged in alternating fashion and wherein said first and second semiconductor material layers are comprised of materials that may be selectively etched relative to one another;
forming a gate structure above said stack;
forming a spacer structure on sidewalls of said gate structure;
etching said stack using said gate structure and said spacer structure as an etch mask to define cavities in said stack, said cavities exposing end portions of said first and second semiconductor material layers;
removing a portion of said spacer structure to define a reduced width spacer structure;
removing portions of said at least one first semiconductor material layer to define end recesses;
forming a layer of insulating material in said end recesses and at least partially filling said cavities; and
etching said stack using said gate structure and said reduced width spacer structure as an etch mask to remove end portions of said at least one second semiconductor material layer and to remove portions of said layer of insulating material not disposed between said first and second semiconductor material layers so as to form inner spacers on ends of said at least one first semiconductor material layer.

12. The method of claim 11, wherein said spacer structure comprises a first spacer and a second spacer formed above said first spacer, and removing said portion of said spacer structure comprises removing said second spacer.

13. The method of claim 11, wherein forming said layer of insulating material comprises performing a conformal deposition process.

14. The method of claim 13, wherein etching said stack using said gate structure and said reduced width spacer structure as an etch mask comprises etching said layer of insulating material to define a second spacer on said spacer structure.

15. The method of claim 11, further comprising forming a source/drain material in said cavities, wherein said inner spacers are disposed between said at least one first semiconductor material layer and said source/drain material.

16. The method of claim 11, further comprising:
removing said gate structure to define a gate cavity exposing said stack of semiconductor material layers;
removing a portion of said at least one first semiconductor material layer exposed by said gate cavity; and
forming a replacement gate structure in said gate cavity and in a space created by the removal of said portion of said at least one first semiconductor material layer.

17. The method of claim 11, wherein said at least one first semiconductor material layer comprises silicon germanium, and said at least one second semiconductor material layer comprises silicon.

18. The method of claim 11, wherein said at least one first semiconductor material layer comprises a plurality of first semiconductor material layers, and said at least one second semiconductor material layer comprises a plurality of second semiconductor material layers alternating with said plurality of said first semiconductor material layers.

19. The method of claim 11, wherein said end portions of said at least one second semiconductor material layer comprises rounded end portions.

* * * * *